United States Patent
Kummle et al.

[11] Patent Number: 5,986,210
[45] Date of Patent: Nov. 16, 1999

[54] MULTI-CHANNEL HOUSING

[75] Inventors: Wolfgang Kummle, Salem-Beuren; Helmut Messmer, Volkertshausen, both of Germany

[73] Assignee: Bodenseewerk Geratetechnik GmbH, Germany

[21] Appl. No.: 08/939,524

[22] Filed: Sep. 29, 1997

[30] Foreign Application Priority Data

Oct. 5, 1996 [DE] Germany ............ 296 17 342 U

[51] Int. Cl.⁶ .................................................. H01R 13/46
[52] U.S. Cl. ........................... 174/59; 361/600; 220/4.02
[58] Field of Search ................ 174/52.1, 52.4, 174/52.6, 59, 17.08, 35 R, 35 C, 50; 361/752, 600; 220/4.02; 439/76.1

[56] References Cited

U.S. PATENT DOCUMENTS

| | | | |
|---|---|---|---|
| 1,171,914 | 2/1916 | Wright | 439/140 |
| 3,271,626 | 9/1966 | Howrilka | 361/798 |
| 4,370,700 | 1/1983 | Duddles et al. | 361/424 |
| 4,620,265 | 10/1986 | Lerude et al. | 361/816 |
| 4,791,531 | 12/1988 | Jessup | 361/736 |
| 4,985,845 | 1/1991 | Gotz et al. | 364/528.21 |
| 5,110,004 | 5/1992 | Albanesi et al. | 426/106 |
| 5,504,659 | 4/1996 | Acatay et al. | 361/816 |
| 5,578,793 | 11/1996 | Lee | 174/52.1 |

FOREIGN PATENT DOCUMENTS

| | | |
|---|---|---|
| 0 404 223 | 12/1990 | European Pat. Off. . |
| 0 579 346 | 1/1994 | European Pat. Off. . |
| GM 17 01 475 | 7/1955 | Germany . |
| AS 10 95 348 | 9/1958 | Germany . |
| 26 29 207 A1 | 6/1976 | Germany . |
| 32 23 355 A1 | 6/1982 | Germany . |
| 85 08 807 U1 | 3/1985 | Germany . |
| 39 40 842 A1 | 12/1989 | Germany . |
| 44 07 492 A1 | 3/1994 | Germany . |

*Primary Examiner*—Dean A. Reichard
*Assistant Examiner*—Dhiru R Patel
*Attorney, Agent, or Firm*—Lee, Mann, Smith, McWilliams, Sweeney and Ohlson

[57] ABSTRACT

The invention relates to a housing for electronical components for two- or multi-channel systems. The housing includes a housing frame, which is separated by electrical screens into two or several electrically screened parts. At least two covers are detachably attached to the housing frame. The covers permit access to the electrically screened parts of the housing frame. Electronical components associated with each channel are arranged in a respective one of the electrically screened parts of the housing. It is possible to accommodate some of the electronical components in the covers. The covers can be provided with connectors.

4 Claims, 2 Drawing Sheets

MULTI-CHANNEL HOUSING

BACKGROUND OF THE INVENTION

This invention relates to a housing for electronical components for two- or multi-channel systems.

DESCRIPTION OF THE PRIOR ART

Electronical controlling means are often used redundantly, i.e. several control circuits are used for one and the same purpose in such a manner that failure of one of the systems does not necessarily result in interruption of the device to be controlled. The electronical components in question can be components of a two-channel thrust control means for aircrafts.

Such housings generally consist of a box having a single top cover. The electronical components are mostly provided on printed circuit cards, which are arraged one above the other in the housing in a so-called sandwich construction. When one or several of the components are subject to failure often other components or printed circuit cards have to be removed in order to achieve access to the defective components.

SUMMARY OF THE INVENTION

One of the objects of the present invention is to provide a housing of the type mentioned above, which allows simple handling of the electronical components.

Another object of the invention is to reduce the number of mechanical components required in a housing of the type mentioned above.

According to the invention this object is achieved in that the housing comprises a housing frame, which is separated by electrical screens into two or several electrically screened parts, and at least two covers detachably attached to said housing frame, said covers permitting access to said electrically screened parts of said housing frame, wherein said electronical components associated with each channel are arranged in a respective one of said electrically screened parts of said housing.

This permits access to the electronical components of each channel without having to remove components of the other channels.

The housing can be provided with one or with several electrical screens depending on the number of parts of the housing, which shall be electrically screened.

At least one of the covers can be adapted to accommodate some of the electronical components. If the components are provided on printed circuit cards, one printed circuit card can be provided in the cover. When such a cover is removed access is permitted to two planes of printed circuit cards, namely one in the cover itself and one in the associated part of the housing frame. Several or even all of the covers can be designed in this manner.

The housing can be generally rectangular in assembled state. The housing frame can have two diametrically opposite projections projecting in opposite directions, each of the covers engaging a respective one of said projections. These projections can be screened parts of the housing frame and be covered by covers, which likewise contains electronical components. In this manner it is possible to arrange printed circuit cards horizontally as well as vertically in the housing. This results in a very compact housing, in which many printed circuit cards are directly accessibly accommodated in the housing.

One or several of the covers can be provided with connectors. This is very advatageous when printed circuit cards having electronical components serving for communication with the exterior of the housing are arranged in the respective cover or in the part of the housing frame covered by this cover.

The housing frame and the screens provided in the housing frame can be one integral piece. This reduces the number of mechanical components of the housing. Furthermore, the fabrication of the housing is more simple, because the housing frame may be manufactured in one single working process, e.g. by milling.

An embodiment of the invention will now be described in greater detail with reference to the accompanying drawings.

DESCRIPTION OF THE PREFERRED EMBODIMENT

In the figures an embodiment of the housing according to invention is illustrated, which housing serves as carrier for two identical control units (channels) for thrust control in aircrafts. Numeral 10 designates a housing frame of one integral piece. The housing frame 10 is divided into two parts by a partition 12 serving as screen and channel separating line. The partition 12 is indicated by dotted lines in FIG. 1.

Figure 1:
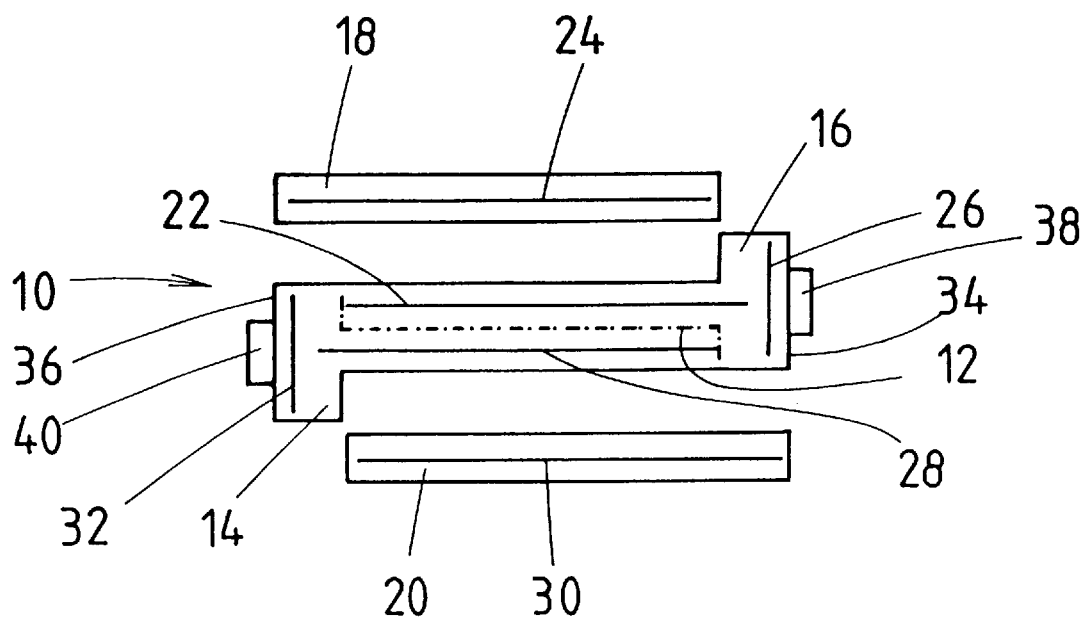
FIG. 1 is a very schematic illustration and shows a side view of an embodiment of the housing for a two-channel system according to the invention.
Figure 2:
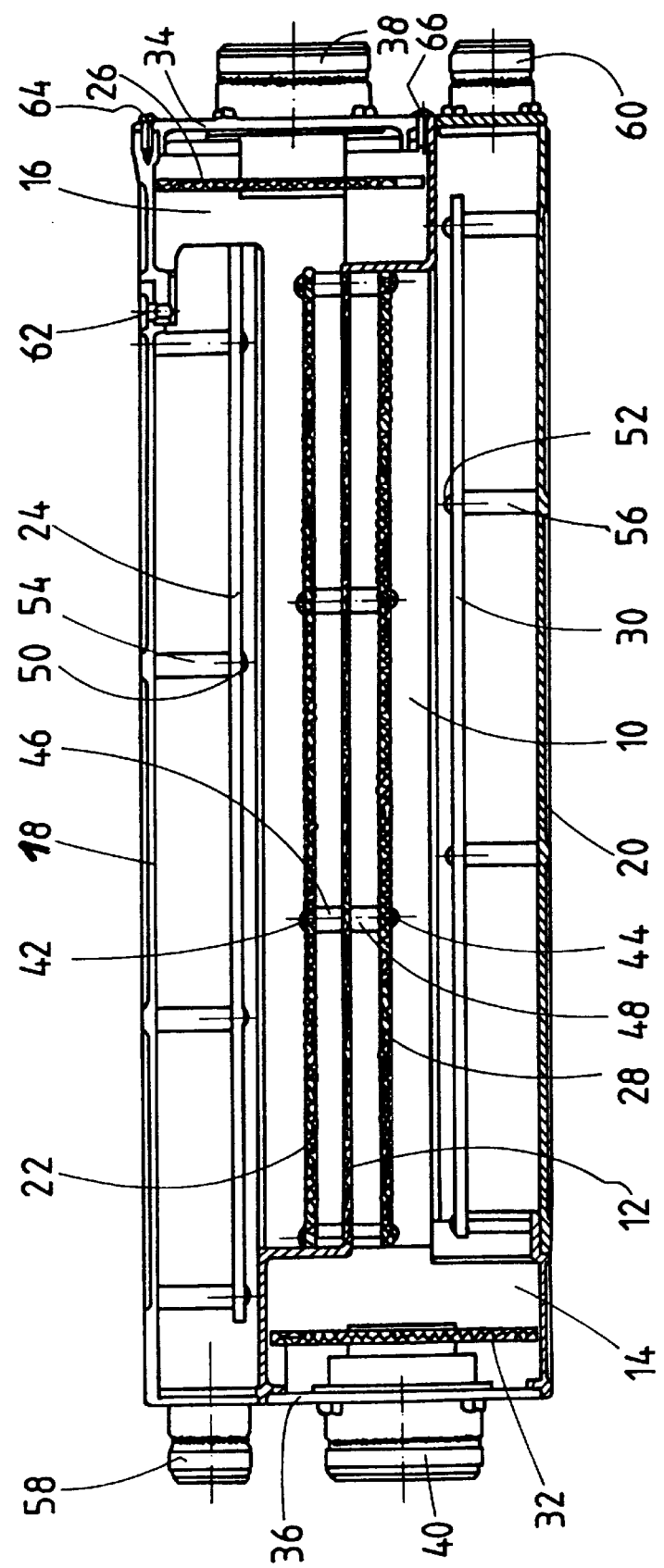
FIG. 2 shows the housing of FIG. 1 in a detained sectional illustration.

The housing frame 10 is generally z-shaped. The end of the housing frame 10 to the left in the figures extends downwards with a first projection 14. The end of the housing frame 10 to the right in the figures extends upwards with a second projection 16. Numerals 18 and 20, respectively, designate a first and a second cover of the housing, respectively. In the illustration of FIG. 1 the first and the second cover 18 and 20, respectively, are removed from the housing frame 10. In the illustration of FIG. 2 the first and the second cover 18 and 20, respectively, are attached to the housing frame 10.

The upper part of the housing frame 10 screened or shielded by the partition 12 from the lower part, the right projection 16 and the first cover 18 together constitute the accommodation for the electronical components associated with the first channel. In the illustrated embodiment these electronical components are arranged at three printed circuit cards, namely a first main printed circuit card 22 located in the housing frame 10, a second main printed circuit card 24 located in the first cover 18 and a connector printed circuit card 26 located in the projection 16. In corresponding manner, the lower part of the housing frame 10 screened by the partition 12 from the upper part, the left projection 14 and the second cover 20 together constitute the accommodation for the electronical components associated with the second channel. In the illustrated embodiment these electronical components are likewise arranged on three printed circuit cards, namely a first main printed circuit card 28 located in the housing frame 10, a second main printed circuit card 30 located in the second cover 20 and a connector printed circuit card 32 located in the projection 14. The connector printed circuit cards 26 and 32 serve as electrical connection of connectors to the exterior of the housing.

In order to facilitate the access to the connector printed circuit cards 26 and 32, respectively, the projections 16 and 14, respectively, are laterally provided with a removable third and fourth cover 34 and 36, respectively. Connectors 38 and 40, respectively, are incorporated in the third and the fourth cover 34 and 36, respectively.

In the detained illustration of the embodiment in FIG. 2 it can be seen that the two first main printed circuit cards 22 and 28 located in the housing frame 10 are directly fixed to the partition 12 on one respective side through screws 42 and 44, respectively, and insulating spacers 46 and 48, respectively. Four such screws and spacers, respectively, associated with each of the two main printed circuit cards 22 and 28 are illustrated in FIG. 2. The two second main printed circuit cards 24 and 30, respectively, provided in the covers 18 and 20, respectively, are attached directly to the inside of the covers 18 and 20, respectively, likewise through screws 50 and 52, respectively, and insulating spacers 54 and 56, respectively. Four such screws and spacers, respectively, associated with each of the two main printed circuit cards 24 and 30 are illustrated in FIG. 2.

Furthermore, in FIG. 2 it can be seen that the first and the second cover 18 and 20, respectively, are provided with lateral connectors 58 and 60, respectively.

The covers 18, 20, 34 and 36 are attached to the housing frame 10 by several screws, of which only one screw 62 of the first cover 18 and two screws 64 and 66 of the third cover 34 are visible in FIG. 2. However, it shall be noted that also other detachable connection means can be used.

In the illustrated embodiment of the housing according to the invention the housing frame 10 as well as the housing in assembled state are diametrically symmetrical, i.e. the shape of the housing and the housing frame 10, respectively, is identical after a rotation by 180° about a vertical and about a horizontal axis in the figures. The two covers 18 and 20 and the two covers 34 and 36 are identical. Due to this symmetry of the housing frame 10 and the identical shape of the covers 18 and 20 and of the covers 34 and 36 the manufacturing of the housing can be made very simple.

The housing according to the invention allows a very simple and direct access to the printed circuit cards simply by removing one of the covers. Furthermore, the manufacturing of the housing and the test and repairing of the electronical units are simple.

The housing and the attachments of the covers are made in such a manner that also general technical requirements such as stability of the housing, protection of the electrical and electronical components within the housing against enviromental influences, separation of the channels and thermal economy are taken into consideration. This is known per se and not described in detail herein.

We claim:

1. A housing for electronical components for two- or multi-channel systems, comprising:

a housing frame, which is separated by electrical screens into two or several electrically screened parts; and at least two covers detachably attached to said housing frame, said at least two covers permitting access to said electrically screened parts of said housing frame, wherein electronical components associated with each channel are arranged in respective one of said electrically screened parts of said housing.

2. The housing of claim 1, wherein:

said housing is generally rectangular in assembled state;

said housing frame has two diametrically opposite projections projecting in opposite directions; and each of said at least two covers engages a respective one of said projections.

3. The housing of claim 1, wherein one or several of said at least covers are provided with connectors.

4. The housing of claim 1, wherein said housing frame and said screens provided in said housing frame are one integral piece.

* * * * *